(12) United States Patent
Becker et al.

(10) Patent No.: US 10,079,219 B2
(45) Date of Patent: Sep. 18, 2018

(54) POWER SEMICONDUCTOR CONTACT STRUCTURE AND METHOD FOR THE PRODUCTION THEREOF

(71) Applicant: DANFOSS SILICON POWER GMBH, Flensburg (DE)

(72) Inventors: Martin Becker, Kiel (DE); Ronald Eisele, Surendorf (DE); Frank Osterwald, Kiel (DE); Jacek Rudzki, Kiel (DE)

(73) Assignee: Danfoss Silicon Power GmbH, Flensburg (DE)

( * ) Notice: Subject to any disclaimer, the term of this patent is extended or adjusted under 35 U.S.C. 154(b) by 0 days.

(21) Appl. No.: 15/523,998

(22) PCT Filed: Oct. 12, 2015

(86) PCT No.: PCT/EP2015/073562
§ 371 (c)(1),
(2) Date: May 3, 2017

(87) PCT Pub. No.: WO2016/071079
PCT Pub. Date: May 12, 2016

(65) Prior Publication Data
US 2017/0317049 A1    Nov. 2, 2017

(30) Foreign Application Priority Data
Nov. 7, 2014   (DE) ................. 10 2014 222 819

(51) Int. Cl.
*H01L 23/34* (2006.01)
*H01L 23/00* (2006.01)

(52) U.S. Cl.
CPC ............. *H01L 24/45* (2013.01); *H01L 24/03* (2013.01); *H01L 24/05* (2013.01); *H01L 24/85* (2013.01);
(Continued)

(58) Field of Classification Search
USPC .... 257/E27.015, E27.017, E27.03, E27.032, 257/E27.109, E29.194–E29.225,
(Continued)

(56) References Cited

U.S. PATENT DOCUMENTS

| | | | | |
|---|---|---|---|---|
| 2012/0106109 A1* | 5/2012 | Kim | ............. | H01L 24/83 361/771 |
| 2014/0225247 A1* | 8/2014 | Becker | ............. | H01L 24/05 257/696 |
| 2014/0230989 A1* | 8/2014 | Becker | ............. | H01L 24/03 156/60 |

FOREIGN PATENT DOCUMENTS

| | | |
|---|---|---|
| DE | 20 2012 004 434 U1 | 8/2012 |
| DE | 10 2011 088 431 A1 | 6/2013 |

(Continued)

OTHER PUBLICATIONS

International Search Report for PCT Serial No. PCT/EP2015/073562 dated Dec. 17, 2015.

(Continued)

*Primary Examiner* — Tram H Nguyen
(74) *Attorney, Agent, or Firm* — McCormick, Paulding & Huber LLP

(57) ABSTRACT

A power semiconductor contact structure for power semiconductor modules, which has at least one substrate 1 and a metal molded body 2 as an electrode, which are sintered one on top of the other by means of a substantially uninterrupted sintering layer 3a with regions of varying thickness. The metal molded body 2 takes the form here of a flexible contacting film 5 of such a thickness that this contacting film is sintered with its side 4 facing the sintering layer 3a onto the regions of varying thickness of the sintering layer substantially over the full surface area. A description is also given of a method for forming a power semiconductor contact structure in a power semiconductor module that has (Continued)

a substrate and a metal molded body. The forming of the power semiconductor contact structure is performed firstly by applying a layer of sintering material of locally varying thickness to either the metal molded body 2 or the substrate, followed by sintering together the contacting film 5 with the substrate 1 by using the properties of the layer of sintering material that are conducive to connection, the contacting film 5 being made to develop its distinct form to correspond to the varying thickness of the layer of sintering material 3a.

18 Claims, 1 Drawing Sheet

(52) U.S. Cl.
CPC ............... *H01L 2224/03505* (2013.01); *H01L 2224/04042* (2013.01); *H01L 2224/05017* (2013.01); *H01L 2224/0518* (2013.01); *H01L 2224/05139* (2013.01); *H01L 2224/05144* (2013.01); *H01L 2224/05147* (2013.01); *H01L 2224/05184* (2013.01); *H01L 2224/45014* (2013.01); *H01L 2224/45147* (2013.01); *H01L 2224/85238* (2013.01)

(58) Field of Classification Search
USPC ... 257/E21.382–E21.385, E21.695–E21.696, 257/163–166, 197, 205, 273, 351, 361, 257/378, 423, 427, 474, 477, 517, 526, 257/539, 544, 565–593, 928, E51.004, 257/E31.069, E27.019–E27.023, 257/E27.037–E27.043, E27.053–E27.058, 257/E27.074–E27.078, E27.106, E27.149, 257/E29.03–E29.035, E29.044–E29.045, 257/E29.144, E29.124, E29.027–E29.028, 257/E29.066–E29.067, E29.194–E29.202, 257/E21.372, E21.38–E21.381, 257/E21.608–E21.313, E21.369–E21.393, 257/E21.382–E21.385, E21.608–E21.613, 257/E27.052, E27.079, E29.036–E29.038, 257/E29.046–E29.048, E29.115, E29.196, 257/E29.211–E29.225, E21.388, 257/E21.614–E21.677, E21.371, E21.387, 257/E21.403–E21.407, E21.441, E21.445, 257/E21.448–E21.452, 135–136, 242, 257/349, E27.091, E27.095–E27.096, 257/E29.118, E29.274, E29.313, E29.318, 257/E29.262, E21.41, E21.629, E21.643; 438/202–208, 234–239, 170, 189, 438/309–378, 136, 137, 156, 173, 192, 438/212
See application file for complete search history.

(56) References Cited

FOREIGN PATENT DOCUMENTS

| | | |
|---|---|---|
| DE | 10 2012 221 396 A1 | 6/2014 |
| JP | 2002-353269 A | 12/2002 |
| WO | 2013/053419 A1 | 4/2013 |
| WO | 2013/053420 A1 | 4/2013 |

OTHER PUBLICATIONS

Fauty J. et al, "Room Temperature Ultrasonic Wirebonding with Large Diameter Copper Wire", International Journal of Microcircuits and Electronic Packaging, International Microelectronics & Packaging Society, vol. 22, No. 3, pp. 221-232, Sep. 21, 1999.
Mertens C. et al, "Top-side chip contacts with low temperature joining technique (LTJT)", Power Electronics Specialist Conference, vol. 6, pp. 4178-4182, Jun. 20, 2004.

\* cited by examiner

POWER SEMICONDUCTOR CONTACT STRUCTURE AND METHOD FOR THE PRODUCTION THEREOF

CROSS-REFERENCE TO RELATED APPLICATIONS

This application is a National Stage application of International Patent Application No. PCT/EP2015/073562, filed on Oct. 12, 2015, which claims priority to German Patent Application No. 102014222819.0, filed on Nov. 7, 2014, each of which is hereby incorporated by reference in its entirety.

TECHNICAL FIELD

The invention relates to a power semiconductor contact structure for power semiconductor modules with a bonding buffer and to a method for the production thereof.

BACKGROUND

Thick-wire bonding, which is also referred to as ribbon bonding, represents a widely used connecting technique, in particular in power electronics. This known connecting technique is used to produce electrical connections between conductor tracks, terminal lugs and component contacts by corresponding bridging by means of wires or ribbons. The connection of the wire to the bonding buffer at the corresponding contact area is produced by static contact pressure and a high-frequency oscillation of a clamping tool, whereby the wire enters into a solid and integral material bond with the contact area in a form of friction welding process. Mainly aluminium and copper wires are used most frequently for the known connecting techniques. Aluminium bonding wires have the advantage over copper bonding wires that they are more ductile and less hard. These known friction welded connections with aluminium wires are generally easy to produce, mainly as a result of an inherently thin layer of aluminium oxide surrounding the wire. This oxide layer adheres firmly to the wire and thereby provides solid support for the required friction during the friction welding process, on the one hand by abrasion of the part to be joined and on the other hand by exposing metallically pure aluminium. Metals, preferably copper, aluminium or metallic coatings, for example in the form of nickel-gold, nickel or else palladium, can be considered as a joining partner.

WO 2013/053420 A1 discloses a power semiconductor chip with metallic molded bodies for connecting thick wires or ribbons and a method for the production thereof. It focuses especially on thick-wire copper bonding technology, for achieving improved load cycle endurance. The known power semiconductor chip has on its upper side potential surfaces on which a metal molded body is fixed in an electrically and thermally well conducting manner. Such a metal molded body is fastened onto a metallization layer of the semiconductor with the aid of a connecting layer by low-temperature sintering technology or else by way of diffusion soldering or adhesive bonding.

WO 2013/053419 A1 describes a method for providing a connection between metal molded bodies and a power semiconductor chip for the connection thereof by thick wires or ribbons. The basic structure of the known power semiconductor chip that is also described there corresponds to that previously mentioned, the production of the metal molded bodies by means of an organic carrier film being addressed especially by this prior art.

Furthermore, DE 20 2012 004 434 U1 likewise describes a metal molded body for providing a connection of a power semiconductor chip with potential surfaces on the upper side to thick wires. This known connecting technology is likewise aimed at copper thick-wire bonding.

All the known methods share the common feature that the connecting of the thick wires or ribbons takes place on a surface of the metal molded body that is substantially smooth, at most has a roughness that is caused during production. While aluminium wires have a solidly bonding oxide layer, copper wires, though they form an oxide, cannot serve as the required means of abrasion during thick-wire bonding because the oxide does not solidly bond. In addition, copper is a harder material than aluminium. On the other hand, copper is a material with a significantly higher thermal conductivity and lower electrical resistance than aluminium, and is therefore to be given priority when choosing the material for the contact wires. In order that a sufficiently good material bond with the metal molded body can be achieved during the wire bonding, i.e. by way of the contact area of the said body, usually the static pressure and the energy input in the ultrasonic welding for the wire bonding are increased significantly. However, this entails the risk of damage to the semiconductor structures being connected to. Especially whenever the contact area on the metal molded body consists of a non-ductile, non-oxidized material, this can give rise to problems in producing a secure bond by means of a thick copper wire with regard to a connection that is reliable under a relatively high number of load cycles.

SUMMARY

Against this background, the object of the present invention is to provide a power semiconductor contact structure, in particular for power semiconductor modules, and also a method for the production thereof, in which especially copper can be used in the thick-wire bonding technology without disadvantages occurring, in particular in comparison with aluminium wires, with regard to an integral connection of the wire to be bonded on the contact area of the metal molded body in the sense of an integral material bond.

According to the invention, the power semiconductor contact structure has at least one substrate and a metal molded body as an electrode, which are sintered one on top of the other by means of a substantially uninterrupted sintering layer with regions of varying thickness. According to the invention, the metal molded body takes the form of a flexible contacting film of such a thickness that this contacting film is sintered with its side facing the sintering layer onto the regions of varying thickness of this sintering layer substantially over the full surface area. This means that the geometrical form of the sintering layer is changed such that locally alternating elevations and depressions are produced in the metal molded body in the form of the flexible contacting film. With locally alternating elevations and depressions of the surface of the contacting film, locally high contact pressures, which are higher than with an even surface, are produced during the wire or ribbon connecting. Thus, when the clamping tools are set in their oscillating motion when producing the connection between the wire and the contacting film, this leads to the desired local abrasion of the copper oxide, and consequently to a bare metal surface, in the course of this oscillating motion. These locally arranged bare metal surfaces are suitable for creating, during the friction welding process, initial welded connections between the bonding wire or ribbon and the part to be joined, in this case the metal molded body in the form of the contacting film. Such an undulating surface created in the contacting film represents as it were a macroscopically bumpy surface. Such a bumpy surface then offers preferred conditions for the forming of the metallic connection by the micro friction welding. Such a bumpy surface offers a higher force of resistance under the oscillating motion of the clamping tool than is offered for example by the given roughness of the part being joined, which represents a microscopically bumpy surface.

It has proven to be particularly advantageous that a film, usually consisting of quite soft copper, the surface of which has been brought into a bumpy form, is provided with a greater strength as a result of the deformation by work hardening that is indeed required for creating elevations and depressions than is the case in the initial state of the copper film at the plastically deformed locations. The greater strength of the contact area is of advantage in particular in the copper bonding process, since it can absorb better the higher forces that occur in the process.

The metal molded body preferably consists of a metal with a melting point at least 300 kelvins higher than that of aluminium and more preferably from a metal from the group comprising copper, silver, gold, molybdenum, tungsten or alloys thereof and/or mixtures thereof.

The sintering layer preferably comprises silver, the substrate and the metal molded body being materially bonded to one another by low-temperature sintering.

According to a further exemplary embodiment of the invention, the metal molded body has a substantially constant thickness and, on its outer side facing away from the sintering layer, replicates the varying thickness of the sintering layer as an uneven, preferably undulating surface. Therefore, depending on the formation of the sintering layer, the molded metal body with its constant thickness is formed as undulating or bumpy on its surface facing the sintering layer and on its surface facing away from it.

On the contacting film, to be precise on its outer side facing away from the sintering layer that has elevations and depressions adapted to the regions of varying thickness, in particular in the form of an undulating structure, copper wire or copper ribbon is preferably metallically connected at least three extreme points. This may, for example, be accomplished in a way that the copper wire or copper ribbon covers at least two elevations with a depression in between, or, alternatively, two depressions with an elevation in between.

The varying thickness of the sintering layer may on the one hand be deliberately brought about, but it may also be produced or created by the sintering material layer being applied before the sintering uniformly thickly between the elements that are to be connected to one another. Since the layer of sintering material is preferably applied in the form of a paste with varying thickness, an undulating sintering layer is obtained after the sintering performed under pressure and with heat input.

The regions of varying thickness are preferably formed in defined patterns of point-like, circular or spiral and/or strip-shaped areas. Point-like is understood in this case as meaning that small circular regions of increased thickness occur. Everywhere where more sintering paste has originally been applied in the form of bumpy structures, corresponding regions of analogous patterns with greater thickness have also formed after the sintering. In order to obtain a very good electrical connection, the joined-together components are sintered in such a way that the metal molded body is connected to the sintering layer with its entire surface that is facing the sintering layer. There are no unconnected regions.

The sintering layer is preferably formed with an average thickness of 70 µm or less. More preferably, the sintering layer has a thickness of 5 to 20 µm, in particular 10 to 15 µm and still more preferably 10 µm. It has surprisingly been found that, even with such thin sintering layers, such regions of differing density can be created even in a defined patterned arrangement.

The contacting film preferably has a thickness of 10 to 105 µm, more preferably of 5 to 70 µm, in particular of 35 µm.

According to a further aspect of the invention, a method for forming a power semiconductor contact structure in a power semiconductor module is described.

The known contact areas, which are arranged on a functional surface for the low-temperature sintering, have an even surface, which merely has roughnesses caused during production. Thus, with the method according to the invention, locally alternating elevations and depressions of this contact area are achieved for the copper thick-wire bonding. In the case of the method according to the invention for forming a power semiconductor contact structure in a power semiconductor module, which has at least one substrate and a metal molded body, firstly a layer of sintering material is applied with locally varying thickness to a first joining surface of the metal molded body formed as a contacting film or to a second joining surface of the substrate. The application of the layer of sintering material is followed by the contacting film being connected to the substrate by using the properties of the layer of sintering material that are conducive to connection between the first and second joining surfaces. After the sintering, the sintering layer comes into being from the layer of sintering material, a distinct form of the contacting film that corresponds to the varying thickness of the sintering layer developing.

The sintering, which is performed in the usual way under pressure and with heat input, is preferably carried out by means of a die, the pressure-exerting face of which that is facing the sintering region being formed in such a way that an undulating sintering layer that has elevations and depressions can be created with it, the contacting film being placed between the actual sintering layer and the pressure-exerting face of the die before the sintering. The sintering is in any event performed in such a way that, after the sintering, the sintering layer has regions of differing thickness, the contacting film substantially following this undulating form, i.e. a form having elevations and depressions, of the sintering layer.

According to a development, before the sintering, the layer of sintering material is applied with uniform thickness to the respective joining surface. The sintering is then performed with a die, which has a deformation-resistant pressure-exerting face in which the undulating form is, as it were, incorporated as a negative impression. Once sintering has been performed, therefore, the die has stamped with its deformation-resistant pressure-exerting surface the negative impression thereof as a positive impression into the sintered surface with the contacting film. According to the invention, this has the effect of forming a sintering layer that has regions of differing thickness and onto which undulating form the contacting film has been sintered substantially over the full surface area. The layer of sintering material preferably has a viscosity which is low enough that, when applying the layer of sintering material, a substantially constant layer thickness is achieved, for example by a certain flowing of the sintering material, and the layer has this constant thickness before the sintering.

According to a development, the layer of sintering material is applied in a pasty form with regions of varying thickness to the respective joining surface. In order that the layer of sintering material in pasty form can be applied, the sintering material has for this purpose a preferably higher viscosity than in the previously described exemplary embodiment. After applying the layer of sintering material with the thickness of the sintering material varying over the surface area of the layer of sintering material, the sintering material is dried in this form, i.e. as it were is fixed in the applied undulating structure. The sintering is subsequently performed with a die, which has an elastically deformable pressure-exerting face. Although this die with the elastically deformable pressure-exerting face is capable of applying the pressure required for the sintering, including the heat input, to the location to be sintered, it substantially maintains the undulating form of the layer of sintering material in the sintering layer and in the contacting film. In order that the pressure-exerting face of the die is provided with the elastically deformable property that is required for realizing this exemplary embodiment, a layer of a soft material is placed between the face of the die that exerts the actual sintering pressure and the metal molded body, i.e. the contacting film. During the sintering, this soft material comes into contact with the metal molded body, which has on the upper side the dried, and consequently fixed, undulating sintering paste. This soft material is preferably a silicone pad or a rubber pad, but may also consist of some other non-porous elastomer. What is decisive is that these pads are made of materials that are highly elastic even at temperatures of up to 300° C., which prevail during the sintering. Materials that have an extremely high cross-linkage in the interior as a material structure, in order that they do not display any plastic flow even under the pressures and temperatures required for the sintering, are used for these pads. The soft material may be designed so that a quasi-hydrostatic pressure profile is produced. The escape of the soft material may be prevented by dies being designed to close in a sealed manner. The pasty form of the layer of sintering material preferably has a viscosity which ensures that, after the application in an undulating structure, it does not flow, so that it is fixed in the subsequent drying process, which takes place before the sintering.

Preferably, metallic connections of a wire or of wires or of a ribbon or of a number of ribbons are bonded to form an electrical connection on the side that is opposite with respect to the first joining surface, i.e. the undulating outer side, of the contacting film. This preferably takes place by micro friction welding.

The fact that the sintering layer under the contact area is not created by a method applied evenly over the surface area, but that locally discrete coating methods are used, means that a layer of sintering material or sintering paste that becomes the sintering layer after sintering is created by placing next to one another depots of sintering paste which, though as a whole they represent an uninterrupted layer, the layer thickness of which fluctuates over the joining surface between local minimum values and local maximum values. Consequently, by applying the sintering paste in discrete depots that lie next to one another and may well touch, a surface that is bumpy before the sintering is obtained. Such a specific variation of the local thickness of the applied layer of the sintering paste may be obtained for example by corresponding choice of the application method used and/or a correspondingly chosen viscosity of the sintering paste.

Preferably, dispensing, jet-print coating, pad printing methods, spraying or screen printing or stencil printing are used for applying the sintering paste in corresponding depots.

In the case of screen printing, thinner layer thicknesses may be achieved by masks or masked regions than in unmasked regions of the screen. In the case of the jet-print method, on the other hand, accumulations in point form are achieved, likewise contributing to regions of thicker layer thickness or thinner layer thickness. In the case of spraying, line-like layer thickness variations lying next to one another are achieved, arranged so as to extend linearly and so as to extend in a curved manner on the respective joining surface. It is also possible here, however, to arrange criss-crossing traces, so that defined patterned layer thickness variations are achieved.

Preferably, the pasty layer of sintering material, i.e. the depots of sintering paste, are applied in a point-like, circular, strip-shaped or spiral manner. The specific application of the sintering paste with varying thickness consequently results in a specific deviation from the plane parallelism of the parts to be connected. After the sintering, the contacting film is sintered together with the undulating structure of the sintering layer, so that it likewise has an undulating structure also on its outer side.

According to a development of the method according to the invention, the contacting film, the layer of sintering material and the substrate are preferably sintered together by low-temperature sintering.

According to a development of the method, work hardening, caused by the plastic deformation of the contacting film, causes the formation of locally created first and locally created second regions, said first regions having a hardness which is higher than the hardness in the second. This means that the regions of varying hardness are arranged side by side.

Preferably, wire or ribbons of copper are used for the bonding for the electrical connecting, the wires or ribbons being integrally connected to the contacting film by copper bonding, i.e. after the bonding they are materially bonded to one another.

A major advantage of the method according to the invention is that of providing a surface for the bonding by means of which a service life of the connection that is longer, in particular even under load cycles, can be provided in the friction welding, in particular micro friction welding, for the electrical connecting with wires or ribbons.

BRIEF DESCRIPTION OF THE DRAWINGS

Further advantages, features and possible applications of the present invention will now be explained with reference to the accompanying drawings. In the drawings.

DETAILED DESCRIPTION

Figure 1:
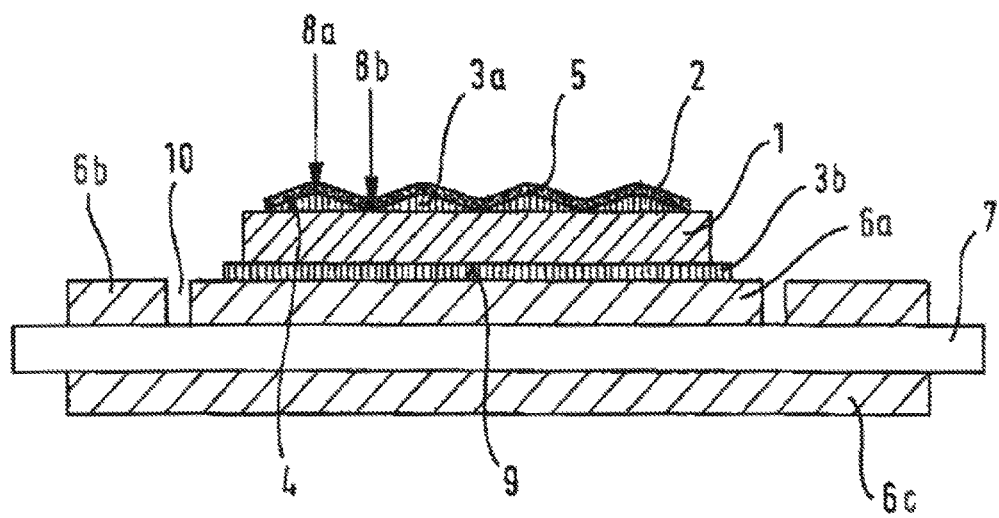
FIG. 1: shows the basic structure of a power semiconductor module with the power semiconductor contact structure according to the invention.

FIG. 1 shows the basic structure of a power semiconductor module with the power semiconductor contact structure according to the invention. According to its basic structure, a substrate or first part to be joined has on its upper side a metal molded body or second part to be joined, which is connected to the substrate 1 by way of a layer of sintering material in the form of a sintering layer 3a, created by low-temperature sintering, on a first joining surface. The metal molded body 2 is formed in an undulating manner, in the form of a contacting film 5, and has with its side 4 that is facing the sintering layer 3a such a form that it is adapted to the undulating structure of the sintering layer 3a in such a way that, in spite of the undulating structure, the side 4 is always sintered onto the sintering layer without any flaws in the connection forming in its entire surface area. The metal molded body 2 is formed as a contacting film in the sense of a flexible thin film. The sintering layer 3a has regions of greater thickness 8a and regions of lesser thickness 8b.

According to the representation in FIG. 1, the substrate 1 is connected on its underside or second joining surface 9 by a further sintering layer 3b on a metallization 6a to a semiconductor 7. The metallization 6a represents an emitter metallization. Also arranged on the upper side of the semiconductor 7 is a metallization 6b for a gate terminal, the metallization 6b being insulated from the emitter metallization 6a by a passivation 10 represented by a gap. Additionally provided on the underside of the semiconductor 7 there is also a further metallization 6c, which offers additional possibilities for the connection of the power semiconductor module.

The undulating structure of the contacting film 5 also offers advantages when connecting terminal wires or terminal ribbons by means of friction welding on its upper side, because the friction welding is performed with simultaneous application of pressure and, when the terminal wires or terminal ribbons are placed on the "bumps" of the undulating structure, the pressure is higher because of the reduced contact area.

Figure 2:
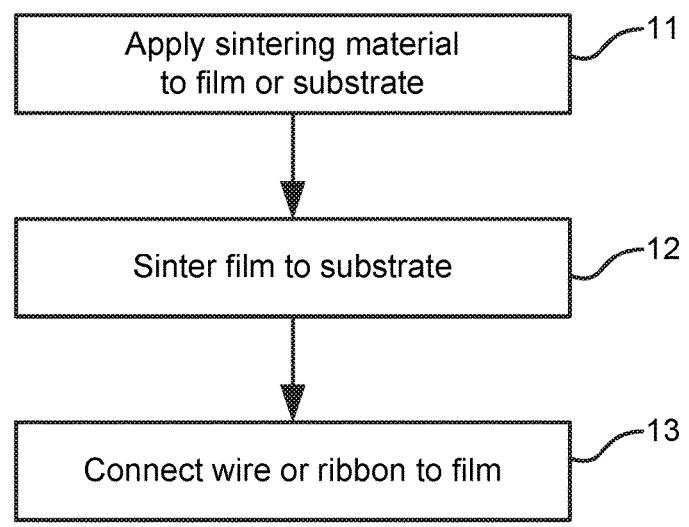
FIG. 2: shows a flow chart of the method according to the invention.

FIG. 2 shows a flow chart of the method for forming a power semiconductor contact structure in a power semiconductor module with at least one substrate and a metal molded body according to the invention. The method comprises the following steps:

firstly, a layer of sintering material as here over described is applied 11 to a first joining surface of the metal molded body formed as a contacting film or to a second joining surface of the substrate, then secondly, the contact film is sintered 12 to the substrate by using the layer of sintering material while forming a sintering layer of locally varying thickness and developing the distinct form of the contacting film to correspond to the varying thickness of the sintering layer.

Also illustrated in FIG. 2 is an optional third step 13, in which wire or ribbons is or are metallically connected to the contacting film at the undulating surface thereof. Such metallic connection may be made using micro friction welding or by copper bonding.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A power semiconductor contact structure for power semiconductor modules with at least one substrate and a metal molded body as an electrode, which are sintered one on top of the other by means of a substantially uninterrupted sintering layer with regions of varying thickness, the metal molded body taking the form of a flexible contacting film of such a thickness that this contacting film is sintered with its side facing the sintering layer onto the regions of varying thickness of the sintering layer substantially over the full surface area.

2. The power semiconductor contact structure for power semiconductor modules according to claim 1, in which the metal molded body consists of a metal with a melting point at least 300 K higher than that of aluminium.

3. The power semiconductor contact structure for power semiconductor modules according to claim 1, in which the metal molded body consists of a metal from the group comprising Cu, Ag, Au, Mo, W or alloys and/or mixtures thereof.

4. The power semiconductor contact structure for power semiconductor modules according to claim 1, in which the sintering layer comprises silver and is created by low-temperature sintering, materially bonding the substrate and the metal molded body.

5. The power semiconductor contact structure for power semiconductor modules according to claim 1, in which the metal molded body has a substantially constant thickness and, on its outer side facing away from the sintering layer, replicates the varying thickness of the sintering layer as an uneven surface.

6. The power semiconductor contact structure according to claim 1, in which on the contacting film that has elevations and depressions and is adapted to the regions of varying thickness.

7. The power semiconductor contact structure for power semiconductor modules according to claim 1, in which the regions of varying thickness are formed in defined patterns of point-like, circular or spiral and or strip-shaped areas.

8. The power semiconductor contact structure for power semiconductor modules according to claim 1, in which the sintering layer has an average thickness of 70 µm or less.

9. The power semiconductor contact structure for power semiconductor modules according to claim 1, in which the sintered layer has an average thickness of 5 to 20 µm, in particular 10 to 15 µm, in particular 10 µm.

10. The power semiconductor contact structure for power semiconductor modules according to claim 1, in which the contacting film has a thickness of 10 to 105 µm, in particular 15 to 70 µm, in particular 35 µm.

11. A method for forming a power semiconductor contact structure in a power semiconductor module with at least one substrate and a metal molded body, comprising the steps of:

applying a layer of sintering material to a first joining surface of the metal molded body formed as a contacting film or to a second joining surface of the substrate; and sintering the contact film to the substrate by using the layer of sintering material having properties that are conducive to connection between the first and second joining surfaces while forming a sintering layer of locally varying thickness and developing the distinct form of the contacting film to correspond to the varying thickness of the sintering layer.

12. The method according to claim 11, in which the sintering is carried out under pressure and with heat input by means of a die, the pressure-exerting face of which is formed to create an undulating sintering layer having elevations and depressions, with a contacting film following this form.

13. The method according to claim 12, in which the layer of sintering material is applied with uniform thickness to the respective joining surface and the sintering is performed by means of a deformation-resistant pressure-exerting face of the die in which the undulating form is incorporated as a negative impression.

14. The method according to claim 12, in which the layer of sintering material in pasty form is applied with regions of varying thickness to the respective joining surface and subsequently dried and the sintering is performed by means of an elastically deformable pressure-exerting face of the die, which substantially maintains the undulating form of the layer of sintering material in the sintering layer and creates it in the contacting film.

15. The method according to claim 14, in which the layer of pasty sintering material is applied by dispensing, jet-print coating, pad printing, spraying or screen or stencil printing.

16. The method according to claim 14, in which the layer of pasty sintering material is applied in defined patterns, for example in a point-like, circular, strip-shaped or spiral manner.

17. The method according to claim 11, in which the sintering is carried out as low-temperature sintering.

18. The method according to claim 11, in which first regions and second regions are created locally in the contacting film, the first regions having a strength that is greater than the strength in the second regions, differing from the first regions.

* * * * *